United States Patent [15] 3,693,055

Beneking [45] Sept. 19, 1972

[54] FIELD EFFECT TRANSISTOR

[72] Inventor: Heinz Beneking, 51 Aachen, Germany

[73] Assignee: Licenta Patent Verwaltungs-G.m.b.H., Frankfurt am Main, Germany

[22] Filed: Jan. 13, 1971

[21] Appl. No.: 106,199

[30] Foreign Application Priority Data

Jan. 15, 1970 Germany..........P 20 01 584.3

[52] U.S. Cl...................................317/235, 317/234
[51] Int. Cl...............................................H01l 13/04
[58] Field of Search..................................317/235 A

[56] References Cited

UNITED STATES PATENTS

| | | | |
|---|---|---|---|
| 3,316,131 | 4/1967 | Wisman | 148/175 |
| 3,413,531 | 11/1968 | Leith | 317/235 |

*Primary Examiner*—James D. Kallam
*Attorney*—Spencer & Kaye

[57] ABSTRACT

A field effect transistor comprises a semiconductor body having a channel region of a first type of conductivity, a control region of a second type of conductivity situated between two main electrodes with which the channel region is provided and an intermediate region of the first type of conductivity situated between the channel and control regions and being less doped than the channel region.

6 Claims, 3 Drawing Figures

PATENTED SEP 19 1972 3,693,055

Inventor:
Heinz Beneking

BY Spencer & Kaye
ATTORNEYS.

FIELD EFFECT TRANSISTOR

BACKGROUND OF THE INVENTION

The present invention relates to a field effect transistor consisting of a semiconductor body which comprises a channel region of the first type of conductivity connected to ohmic main electrodes and a semiconductor region of the second type of conductivity serving as a control region and disposed between the main electrodes.

In contrast to field effect transistors with insulated gate electrode, the present component is a so-called blocking field effect transistor. Such a field effect transistor generally consists of a basic semiconductor body on which a channel region is provided or into which a channel region is introduced. This channel region comprises, at the semiconductor surface, two ohmic main electrodes which are generally termed source and drain electrodes. These terms will also be used hereinafter in this Patent Application. In a known form of construction, for example, a channel of n-type conductivity is surrounded by regions of p-type conductivity. These regions of p-type conductivity form control regions. With negative bias of the control regions in comparison with the source connection, the barrier layers of the blocked p-n junction grow into the channel region and constrict the cross-section for the flow of current. The constriction continues until, at a specific control voltage, the flow of current is completely suppressed. A blocking field effect transistor may also be constructed so that a channel region of the same type of conductivity but with heavier doping is disposed on a high-resistance basic semiconductor body of the first type of conductivity. This channel region then borders on a control region of the second type of conductivity. The transport of current is effected essentially in the relatively low-resistance channel region because the extremely high-resistance basic semiconductor body only takes over an insignificantly small proportion of current.

In the known blocking field effect transistors, the reactive capacitance between the gate electrode and the drain electrode is still so great that, inter alia, the cut-off frequency of the known field effect transistors could not be increased to the required extent.

SUMMARY OF THE INVENTION

It is an object of the invention to provide a blocking effect transistor in which the reactive capacitance can be reduced.

According to the invention, there is provided a field effect transistor comprising a semiconductor body, a channel region of a first type of conductivity in said semiconductor body, two ohmic main electrodes connected to said channel region, a control region of a second type of conductivity in said semiconductor body between said ohmic main electrodes, and an intermediate region of said first type of conductivity but with a doping less than that of said channel region and disposed in said semiconductor body between said channel region and said control region.

BRIEF DESCRIPTION OF THE DRAWINGS

The invention will now be described in greater detail, by way of example, with reference to the accompanying drawings, in which.

DESCRIPTION OF THE PREFERRED EMBODIMENTS

Basically, in a field effect transistor consisting of a semiconductor body which comprises a channel region of the first type of conductivity connected to ohmic main electrodes and a semiconductor region of the second type of conductivity serving as a control region and disposed between the main electrodes it is proposed that a semiconductor region of the first type of conductivity, the doping of which is less than that of the channel region, should be disposed between the channel region and the control region. By this means, the effect is achieved that the space-charge region free of charge carriers which extends from the control region of the second type of conductivity in the operating state can expand into the weakly doped semiconductor region between the control region and the channel region of the first type of conductivity. By this means, the effect is achieved that the barrier-layer capacitance of the p-n junction bounding the control region of the second type of conductivity in the operating state can expand into the weakly doped semiconductor region between the control region and the channel region of the first type of conductivity. By this means, the effect is achieved that the barrier-layer capacitance of the p-n junction bounding the control region is kept very low. With such an arrangement of regions, a certain bias is necessary at the control region before an appreciable channel constriction is effected because the space-charge region only penetrates into the actual channel region after passing through the weakly doped semiconductor region. Since the doping of the semiconductor region between the channel region and the control region is kept very low, however, low bias voltage values are sufficient for the space-charge region to abut against the channel region.

In a planar construction of the field-effect transistor according to the invention, the control region for example is surrounded on all sides by the semiconductor region with low doping. The doping of the channel region may be selected ten times greater for example than that of the semiconductor region situated between the channel region and the control region.

Figure 1:
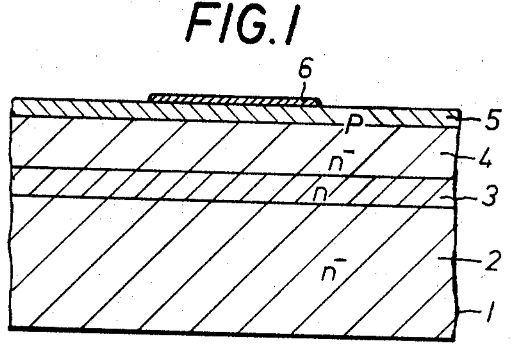
FIG. 1 is a sectional view of a semiconductor body during the formation of a field effect transistor in accordance with the invention.

Referring now to the drawings, in FIG. 1, a multilayer semiconductor body 1 is illustrated in section. The individual layers are preferably applied epitaxially to a basic semiconductor body 2. In order to produce the field-effect transistor according to the invention, the starting point may, for example, be a weakly doped and therefore high-resistance basic semiconductor body 2 of n-type conductivity. In a preferred embodiment, the specific resistance of this basic body, which consists for example of monocrystalline silicon, is 1,000 ohm cm. This basic body is relatively thick in comparison with the semiconductor layers provided above it. The semiconductor layer 3 of n-type conductivity provided on the basic body forms the actual channel region of the semiconductor component to be produced. This layer 3 is 0.1 to 0.2 $\mu$m thick for example and has a specific resistance of 0.1 ohm cm. On the channel region 3, there is provided a further semiconductor layer 4 which has the same type of conductivity as the channel region and the basic semiconductor body. This semiconductor region 4 is more weakly doped than the channel region and has a specific resistance of 1 ohm cm for example. Its thickness is about 1 $\mu$m. A region 5 of the second type of conductivity is provided on the region 4 as a last semiconductor layer. This layer, which is then of p-type conductivity in the present example, can be produced by diffusion or by epitaxial deposition.

Figure 2:
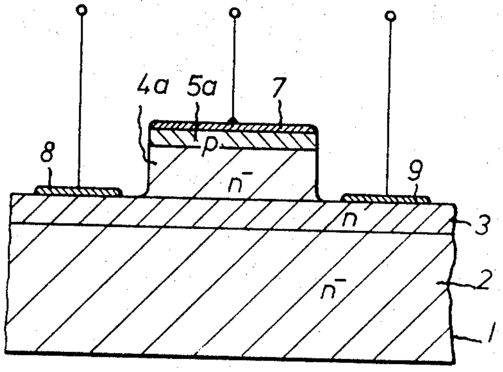
FIG. 2 is a sectional view similar to FIG. 1 of the completed transistor.

In order to obtain a semiconductor device as shown in FIG. 2, the central portion of the semiconductor surface for example is covered with an etch-resistant masking layer.

This masking layer 6 consists of silicon dioxide for example. The semiconductor device illustrated in FIG. 1 is exposed to a selective etchant until the lateral marginal portion of the semiconductor layer 4 and 5 has been etched away at least at two points. Then a semiconductor device as shown in FIG. 2 remains wherein a heavily doped channel region 3 is provided over a weakly doped basic semiconductor body. The main electrodes 8 and 9 which serve as source and drain electrodes are provided on this channel region and are electrically separated from one another at the surface of the semiconductor by a remaining mesa-shaped semiconductor region 4*a*. This mesa-shaped semiconductor region 4*a* consists of weakly doped semiconductor material which comprises, at its free surface, a control region 5*a* which forms a p-n junction with the semiconductor 4*a*. A gate electrode 7, through which the control potential is supplied to the semiconductor device, is fitted to the control region. The control potential is selected so that the p-n junction between the control region 5*a* and the high-resistance semiconductor region 4*a* is stressed in the reverse direction. In this case, a space-charge region which is free of charge carriers extends into the weakly doped semiconductor region 4*a*, starting from the p-n junction, and, beyond a specific threshold voltage, also extends into the channel region 3 and constricts this channel region to a greater or lesser extent.

Figure 3:
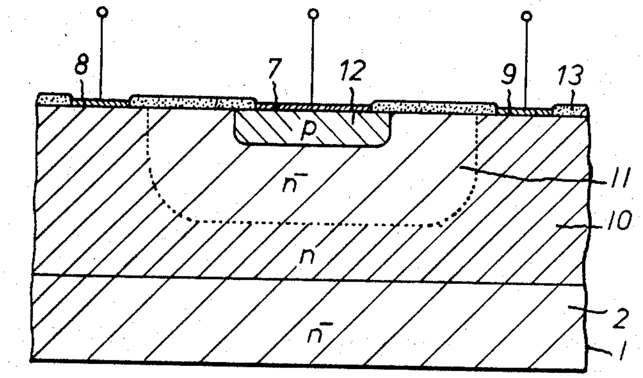
FIG. 3 is a sectional view similar to FIG. 1 of a completed field effect transistor of the planar type.

The equivalent planar semiconductor device to FIG. 2 is illustrated in FIG. 3. The starting point is again a weakly doped semiconductor body of n-type conductivity on which there is disposed a heavily doped semiconductor layer of n-type conductivity 1 to 2 $\mu$m thick for example. The semiconductor surface is preferably covered with a diffusion masking layer 13, for example of silicon dioxide. Using the masking layer 13, a weakly doped semiconductor region 11 of n-type conductivity is diffused into the central region of the semiconductor layer of n-type conductivity. This region 11 is obtained, for example, by impurities in the semiconductor region of n-type conductivity being diffused into the semiconductor body and forming acceptors in the semiconductor body. The concentration of these acceptors is only selected so high, however, that no reversal of the doping takes place but only an increase in the specific resistance. Between the semiconductor region 11 produced by counter-doping and the basic semiconductor body 2 which is likewise weakly doped, there remains the channel region 10 which borders on the semiconductor surface at the margin of the semiconductor body at two points which are separated from one another at the semiconductor surface by the region 11 and the control region 12 introduced into the region 11. Contact is made to the channel region by the main electrodes 8 and 9 at these points. The control region 12 of p-type conductivity is preferably produced by diffusion. The mode of operation of the semiconductor device illustrated in FIG. 3 corresponds to that of the semiconductor device illustrated in FIG. 2. Here, too, the region 11 serves as a buffer region reducing the capacitance between the actual control region 12 and the channel region 10.

It is obvious that with the semiconductor devices described, a reversal of the type of conductivity of various semiconductor areas and regions is easily possible. In addition, a heavily doped basic semiconductor body of the opposite type of conductivity to the channel region may be used instead of a weakly doped semiconductor body of the type of conductivity of the channel region.

It will be understood that the above description of the present invention is susceptible to various modifications changes and adaptations.

What is claimed is:

1. A field effect transistor comprising a high resistance basic semiconductor body of a first type of conductivity, a low-resistance semiconductor layer of said first type of conductivity provided on said basic semiconductor body and forming a channel region, two main electrodes spaced apart on said low-resistance semiconductor layer, and a mesa-like semiconductor area on said low-resistance semiconductor region between said two main electrodes and including a control region of a second type of conductivity at the free surface of said mesa-like semiconductor area and an intermediate region of said first type of conductivity which is less doped than said low-resistance semiconductor layer between said low-resistance semiconductor layer and said region of said second type of conductivity.

2. A field effect transistor as defined in claim 1, wherein said channel region has a specific resistance of about 0.1 ohm cm and said intermediate region has a specific resistance of about 1 ohm cm.

3. A field effect transistor as defined in claim 1, wherein said channel region, said control region and said intermediate region are epitaxially formed regions.

4. A field effect transistor comprising, in combination:

a high-resistance basic semiconductor body of a first conductivity type;

a low-resistance semiconductor layer of said first conductivity type on a major surface of said semiconductor body to provide a channel region for the transistor; a pair of spaced main electrodes ohmically contacting said low resistance semiconductor layer; a mesa-like semiconductor region on the portion of the major surface of said low-resistance semiconductor layer between said main electrodes, said mesa-like semiconductor region including a semiconductor region of said first conductivity type which is more weakly doped than said low-resistance semiconductor layer and which contacts said major surface of said low-resistance semiconductor layer, and a semiconductor control region of the opposite conductivity type extending along the free major surface of said mesa-like semiconductor region and spaced from said low-resistance semiconductor layer by said more weakly doped semiconductor region; and a control electrode ohmically contacting said semiconductor control region.

5. A field effect transistor as defined in claim 4 wherein said low-resistance semiconductor region has a specific resistance of about 0.1 ohm cm and said more weakly doped semiconductor region has a specific resistance of about 1.0 ohm cm.

6. A field effect transistor as defined in claim 4 wherein said low-resistance semiconductor layer, said semiconductor control region and said more weakly doped semiconductor region are epitaxially formed regions.

* * * * *

UNITED STATES PATENT OFFICE
CERTIFICATE OF CORRECTION

Patent No. 3,693,055 Dated September 19th, 1972

Inventor(s) Heinz Beneking

It is certified that error appears in the above-identified patent and that said Letters Patent are hereby corrected as shown below:

In the heading of the patent, line 4, change "Licenta" to --Licentia--.

Signed and sealed this 13th day of March 1973.

(SEAL)
Attest:

EDWARD M.FLETCHER,JR.
Attesting Officer

ROBERT GOTTSCHALK
Commissioner of Patents

FORM PO-1050 (10-69)
USCOMM-DC 60376-P69
☆ U.S. GOVERNMENT PRINTING OFFICE : 1969 O—366-334